(12) United States Patent
Butz et al.

(10) Patent No.: US 9,371,684 B2
(45) Date of Patent: *Jun. 21, 2016

(54) COATED ARTICLE WITH IR REFLECTING LAYER(S) AND METHOD OF MAKING SAME

(71) Applicant: Guardian Industries Corp., Auburn Hills, MI (US)

(72) Inventors: Jochen Butz, Wolfen (DE); Uwe Kriltz, Jena (DE); Artur Siwek, Czestochowa (PL); Anton Dietrich, Fontnas (CH); Jens-Peter Muller, Differdange (LU); Jean-Marc Lemmer, Wincheringen (DE); Richard Blacker, Lino Lakes, MN (US)

(73) Assignees: Centre Luxembourgeois de Recherches Pour le Verre et la Ceramique S.A. (C.R.V.C.), Grand Duchy de Luxembourg (LU); Guardian Industries Corp., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/801,869

(22) Filed: Jul. 17, 2015

(65) Prior Publication Data

US 2015/0322709 A1 Nov. 12, 2015

Related U.S. Application Data

(60) Continuation of application No. 12/153,057, filed on May 13, 2008, now Pat. No. 9,090,504, which is a division of application No. 11/029,025, filed on Jan. 5, 2005, now Pat. No. 7,390,572.

(60) Provisional application No. 60/625,164, filed on Nov. 5, 2004.

(51) Int. Cl.
*B05D 5/06* (2006.01)
*E06B 3/67* (2006.01)

(Continued)

(52) U.S. Cl.
CPC ............... *E06B 3/6715* (2013.01); *B32B 17/06* (2013.01); *B32B 37/18* (2013.01); *C03C 17/36* (2013.01);

(Continued)

(58) Field of Classification Search
CPC .. C03C 17/3618; C03C 17/366; C03C 17/36; C03C 17/3694; C03C 17/3681; C03C 17/3626; C03C 17/3652; C03C 17/3644; C03C 2217/78
See application file for complete search history.

(56) References Cited

U.S. PATENT DOCUMENTS 5,344,718 A 9/1994 Hartig et al.
5,514,476 A 5/1996 Hartig et al.

(Continued)

FOREIGN PATENT DOCUMENTS

EP 1 293 489 3/2003
EP 1 375 445 1/2004

(Continued)

OTHER PUBLICATIONS

U.S. Appl. No. 12/153,057, filed May 13, 2008; Butz et al.

(Continued)

*Primary Examiner* — Michael Wieczorek
*Assistant Examiner* — Michael G Miller
(74) *Attorney, Agent, or Firm* — Nixon & Vanderhye P.C.

(57) ABSTRACT

A coated article is provided with at least one infrared (IR) reflecting layer. The IR reflecting layer may be of silver or the like. In certain example embodiments, a titanium oxide layer is provided over the IR reflecting layer, and it has been found that this surprisingly results in an IR reflecting layer with a lower specific resistivity (SR) thereby permitting thermal properties of the coated article to be improved.

9 Claims, 5 Drawing Sheets

(51) Int. Cl.
*C03C 17/36* (2006.01)
*B32B 37/18* (2006.01)
*B32B 17/06* (2006.01)

(52) U.S. Cl.
CPC ........... *C03C 17/366* (2013.01); *C03C 17/3618* (2013.01); *C03C 17/3626* (2013.01); *C03C 17/3639* (2013.01); *C03C 17/3644* (2013.01); *C03C 17/3649* (2013.01); *C03C 17/3652* (2013.01); *C03C 17/3657* (2013.01); *C03C 17/3668* (2013.01); *C03C 17/3681* (2013.01); *C03C 17/3694* (2013.01); *B32B 2255/205* (2013.01); *B32B 2255/26* (2013.01); *B32B 2307/204* (2013.01); *B32B 2307/416* (2013.01); *B32B 2315/08* (2013.01); *B32B 2551/00* (2013.01); *C03C 2217/70* (2013.01); *C03C 2217/78* (2013.01); *C03C 2218/154* (2013.01)

(56) References Cited

U.S. PATENT DOCUMENTS

| | | | |
|---|---|---|---|
| 5,552,180 A | 9/1996 | Finley et al. | |
| 5,770,321 A | 6/1998 | Hartig et al. | |
| 5,800,933 A | 9/1998 | Hartig et al. | |
| 5,834,103 A | 11/1998 | Bond et al. | |
| 5,948,538 A | 9/1999 | Brochot et al. | |
| 6,210,784 B1 | 4/2001 | Rondeau et al. | |
| 6,287,675 B1 | 9/2001 | Guiselin et al. | |
| 6,398,925 B1 | 6/2002 | Arbab et al. | |
| 6,524,714 B1 | 2/2003 | Neuman et al. | |
| 6,541,084 B2 | 4/2003 | Wang | |
| 6,572,940 B1 | 6/2003 | Noethe et al. | |
| 6,576,349 B2 | 6/2003 | Lingle et al. | |
| 6,582,809 B2 | 6/2003 | Boire et al. | |
| 6,589,658 B1 | 7/2003 | Stachowiak | |
| 6,602,587 B2 | 8/2003 | Macquart et al. | |
| 6,632,491 B1 * | 10/2003 | Thomsen | C03C 17/36 156/109 |
| 6,667,121 B2 | 12/2003 | Wang | |
| 6,673,427 B2 | 1/2004 | Guiselin et al. | |
| 6,673,438 B1 | 1/2004 | Bond et al. | |
| 6,686,050 B2 | 2/2004 | Lingle et al. | |
| 6,692,831 B2 | 2/2004 | Stachowiak | |
| 6,749,941 B2 | 6/2004 | Lingle | |
| 6,782,718 B2 | 8/2004 | Lingle et al. | |
| 6,802,943 B2 | 10/2004 | Stachowiak | |
| 7,390,572 B2 | 6/2008 | Butz et al. | |
| 9,090,504 B2 * | 7/2015 | Butz | C03C 17/36 |
| 2003/0150711 A1 | 8/2003 | Laird | |
| 2003/0170466 A1 | 9/2003 | Stachowiak | |
| 2003/0198816 A1 | 10/2003 | Lingle et al. | |
| 2004/0086723 A1 | 5/2004 | Thomsen et al. | |
| 2004/0121165 A1 | 6/2004 | Laird | |

FOREIGN PATENT DOCUMENTS

| | | |
|---|---|---|
| EP | 1 734 019 | 12/2006 |
| WO | WO 03/055816 | 7/2003 |
| WO | WO 2004/026633 | 4/2004 |
| WO | WO 2006/078479 | 7/2006 |

OTHER PUBLICATIONS

U.S. Appl. No. 60/625,164, filed Nov. 5, 2004 (Butz et al.).
U.S. Appl. No. 11/029,025, filed Jan. 5, 2005 (Butz et al.).
EP Summons to Attend Oral Hearing for EP 05851245.0 dated Apr. 16, 2015.
US 4,960,645, 10/1990, Lingle et al. (withdrawn).

* cited by examiner

COATED ARTICLE WITH IR REFLECTING LAYER(S) AND METHOD OF MAKING SAME

This application is a continuation of application Ser. No. 12/153,057, filed May 13, 2008 (now U.S. Pat. No. 9,090,504), which is a divisional of application Ser. No. 11/029,025, filed Jan. 5, 2005 (now U.S. Pat. No. 7,390,572), which claims priority on U.S. Provisional Application No. 60/625,164, filed Nov. 5, 2004, the entire disclosures of which are all hereby incorporated herein by reference in this application.

This application relates to a coated article including at least one infrared (IR) reflecting layer of a material such as silver or the like. In certain embodiments, the provision of a layer comprising titanium oxide over the IR reflecting layer has been found to improve the quality of the IR reflecting layer thereby permitting the coated article for example to realize improved thermal properties such as one or more of emittance, U-value, and/or specific resistivity. Coated articles herein may be used in the context of insulating glass (IG) window units, or in other suitable applications such as monolithic window applications, laminated windows, and/or the like.

BACKGROUND AND SUMMARY OF EXAMPLE EMBODIMENTS OF THE INVENTION

Coated articles are known in the art for use in window applications such as insulating glass (IG) window units, vehicle windows, monolithic windows, and/or the like. In certain example instances, designers of coated articles often strive for a combination of high visible transmission, substantially neutral color, low emissivity (or emittance), low sheet resistance ($R_s$), low U-values in the context of IG window units, and/or low specific resistivity. High visible transmission and substantially neutral color may permit coated articles to be used in applications where these characteristics are desired such as in architectural or vehicle window applications, whereas low-emissivity (low-E), low sheet resistance, and low specific resistivity characteristics permit such coated articles to block significant amounts of IR radiation so as to reduce for example undesirable heating of vehicle or building interiors.

Consider a typical coated article with the following layer stack. This coated article is suitable for use in an IG (insulation glass) window unit. For the coated article listed below, the coating includes layers that are listed from the glass substrate outwardly.

| Layer Glass | Thickness (Å) |
|---|---|
| $TiO_x$ | 140 Å |
| $SnO_x$ | 100 Å |
| $ZnAlO_x$ | 70 Å |
| Ag | 118 Å |
| $NiCrO_x$ | 20 Å |
| $SnO_x$ | 223 Å |
| $SiN_x$ | 160 Å |

The silver (Ag) layer of the above coated article has a thickness of 118 angstroms (Å) and a sheet resistance ($R_s$) of 4.6 ohms/square. This translates into a specific resistivity ($R_s$ multiplied by thickness of the IR reflecting layer) for the silver IR reflecting layer of 5.43 micro-ohms·cm.

While the aforesaid specific resistivity (SR) of the silver IR reflecting layer is adequate in many situations, it would be desirable to improve upon the same. For example, if the specific resistivity (SR) of the silver layer could be lowered, then the coating could realize improved thermal properties (e.g., lower U-value, lower emittance, and/or the like) given an IR reflecting layer of the same thickness. Thus, a lower specific resistance of the IR reflecting layer(s) is desirable, as it permits thermal properties of the coating to be improved.

In view of the above, it will be appreciated that there exists a need in the art for a coated article including a coating which has good thermal properties. Certain example embodiments of this invention relate to a coated article which permits thermal properties to be improved.

In certain example embodiments of this invention, it has surprisingly been found that the provision of a layer comprising titanium oxide over an IR reflecting layer (e.g., of silver or the like) unexpectedly improves the quality of the IR reflecting layer thereby permitting the coated article to realized improved thermal properties with a given thickness of the IR reflecting layer. In certain example embodiments, the titanium oxide layer may be provided over the IR reflecting layer, and may be located between a first layer comprising $NiCrO_x$ and a second layer comprising a metal oxide such as tin oxide. Even though the titanium oxide need not be directly contacting the IR reflecting layer, it still surprisingly improves the quality of the underlying IR reflecting layer thereby permitting thermal properties of the coating to be improved.

In certain example embodiments of this invention, the provision of the titanium oxide layer over the IR reflecting layer surprisingly results in an IR reflecting layer with a lower specific resistivity (SR). The lower the SR of an IR reflecting layer, the lower the emittance of the coated article with an IR reflecting layer of a given thickness. Likewise, the lower the SR of an IR reflecting layer, the lower the U-value of an IG unit including a similar coating having an IR reflecting layer of a given thickness. Thus, lowering the SR of an IR reflecting layer permits thermal properties of a coated article to be improved given an IR reflecting layer(s) of like thickness. Alternatively, lowering the SR of an IR reflecting layer permits thermal properties of a coated article to remain substantially the same while reducing the thickness of the IR reflecting layer(s) which may be desirable for increasing visible transmission or the like in certain situations.

Thus, it can be seen that lowering the SR of an IR reflecting layer is advantageous. As discussed herein, it has been found that the provision of the titanium oxide layer over the IR reflecting layer surprisingly results in an IR reflecting layer with a lower SR.

In certain example embodiments of this invention, the titanium oxide layer over the IR reflecting layer may be oxidation graded. In certain example embodiments, the titanium oxide layer may be more oxided at a location further from the IR reflecting layer than at a location closer to the IR reflecting layer. Surprisingly, this has been found to improve the adhesion of the titanium oxide layer to the underlying layer such as a layer comprising $NiCrO_x$ or silver. In other example embodiments of this invention, the titanium oxide layer may be more oxided at a location proximate a central portion of the layer than at respective locations closer to the upper and lower surfaces of the layer. Again, this has been found to improve the adhesion of the layer comprising titanium oxide to the layers below and above the titanium oxide.

In certain example embodiments of this invention, there is provided a coated article including a coating supported by a glass substrate, the coating comprising a dielectric layer; an infrared (IR) reflecting layer comprising silver located on the substrate over the dielectric layer; a layer comprising an oxide of Ni and/or Cr located over and directly contacting the IR reflecting layer comprising silver; a layer comprising titanium oxide located over and directly contacting the layer comprising the oxide of Ni and/or Cr; a layer comprising a metal oxide located over and directly contacting the layer comprising titanium oxide; and a layer comprising silicon nitride located over the layer comprising the metal oxide.

In other example embodiments of this invention, there is provided a coated article including a coating supported by a glass substrate, the coating comprising a layer comprising zinc oxide; an infrared (IR) reflecting layer comprising silver located on the substrate over and contacting the layer comprising zinc oxide; a layer comprising titanium oxide located over the IR reflecting layer; a layer comprising silicon nitride and/or metal oxide located over the layer comprising titanium oxide; and wherein the IR reflecting layer has a specific resistivity (SR) of no greater than 5.0 micro-ohms·cm.

In still further example embodiments of this invention, there is provided a method of making a coated article, the method comprising providing a glass substrate; forming a dielectric layer on the substrate; forming an IR reflecting layer comprising silver on the substrate over at least the dielectric layer; depositing a layer comprising titanium oxide on the substrate over the IR reflecting layer in a manner so that the layer comprising titanium oxide as deposited is more oxided at a location therein further from the IR reflecting layer than at a location closer to the IR reflecting layer.

DETAILED DESCRIPTION OF EXAMPLE EMBODIMENTS OF THE INVENTION

Figure 1:
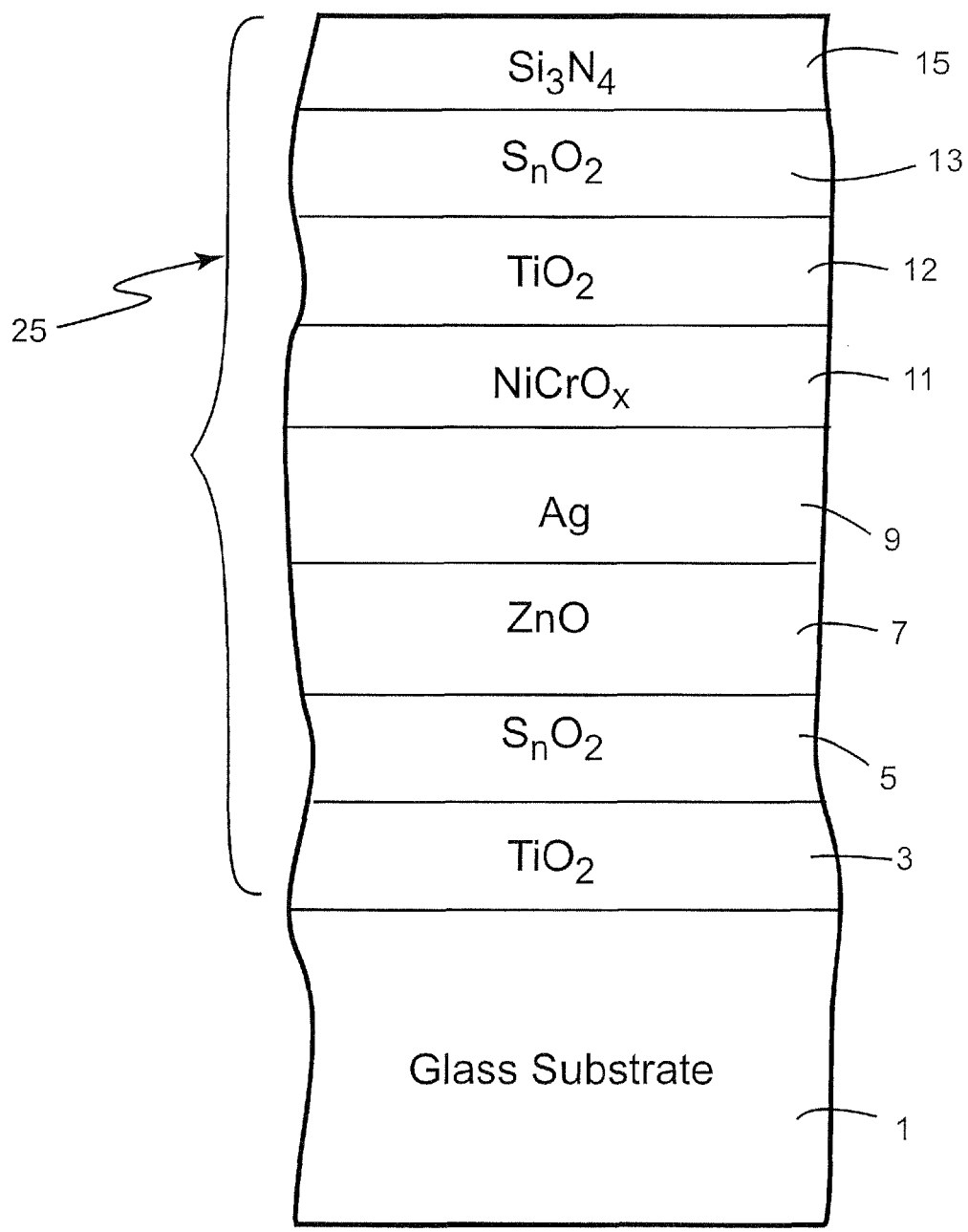
FIG. 1 is a cross sectional view of a coated article according to an example embodiment of this invention.

Referring now to the drawings in which like reference numerals indicate like parts throughout the several views.

Coated articles herein may be used in applications such as monolithic windows, IG window units, vehicle windows, and/or any other suitable application that includes single or multiple substrates such as glass substrates.

In certain example embodiments of this invention, it has surprisingly been found that the provision of a layer consisting essentially of or comprising titanium oxide (e.g., $TiO_x$, where x may be from about 1.5 to 2.5, more preferably from about 1.65 to 2, even more preferably from about 1.75 to 2, or any other suitable value) over an IR reflecting layer unexpectedly improves the quality of the IR reflecting layer thereby permitting the coated article to realized improved thermal properties with a given thickness of the IR reflecting layer. Another example advantage of the provision of the titanium oxide layer over the IR reflecting layer is that it permits antireflection characteristics of the coated article to be improved, which results in a higher visible transmission through the coating. Thus, the titanium oxide layer also permits visible transmission to be increased in certain example embodiments, and/or permits a thicker silver-based IR reflecting layer to be used without sacrificing visible transmission, in certain example embodiments of this invention.

In certain example embodiments, the titanium oxide layer may be provided over the IR reflecting layer, and may be located between (a) a first layer comprising an oxide of Ni and/or Cr, and (b) a second layer comprising a metal oxide such as tin oxide or alternatively a layer comprising silicon oxynitride and/or silicon nitride. In certain example embodiments of this invention, the provision of the titanium oxide layer over the IR reflecting layer surprisingly results in an IR reflecting layer with a lower specific resistivity (SR). The lower the SR of an IR reflecting layer, the lower the emittance of the coated article with an IR reflecting layer of a given thickness. Likewise, the lower the SR of an IR reflecting layer, the lower the U-value of an IG unit including a similar coating having an IR reflecting layer of a given thickness. Thus, lowering the SR of an IR reflecting layer permits thermal properties of a coated article to be improved given an IR reflecting layer(s) of like thickness. Alternatively, lowering the SR of an IR reflecting layer permits theinial properties of a coated article to remain substantially the same while reducing the thickness of the IR reflecting layer(s) which may be desirable for increasing visible transmission or the like in certain situations.

In certain example embodiments of this invention, the coating is designed in a manner so that the IR reflecting layer 9 (e.g., silver layer) has a specific resistivity (SR) of no greater than 5.0, more preferably no greater than 4.8, and even more preferably no greater than 4.6 micro-ohms·cm. Such low SR values permit U-values and emittance of the coating to be lowered given a particular thickness for the IR reflecting layer(s).

FIG. 1 is a cross sectional view of a coated article according to an example embodiment of this invention. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating (or layer system) provided on the substrate either directly or indirectly. As shown in FIG. 1, the coating 25 comprises dielectric layer 3, dielectric layer 5, zinc oxide inclusive layer 7, IR reflecting layer 9 including or of silver, gold, or the like, upper contact layer 11 of or including an oxide of nickel chrome (e.g., $NiCrO_x$), a layer 12 consisting of or comprising titanium oxide ($TiO_x$), a metal oxide inclusive layer 13, and dielectric layer 15 of or including a material such as silicon nitride and/or silicon oxynitride which may in certain example instances be a protective overcoat. Other layers and/or materials may also be provided in certain example embodiments of this invention, and it is also possible that certain layers may be removed or split in certain example instances.

Figure 2:
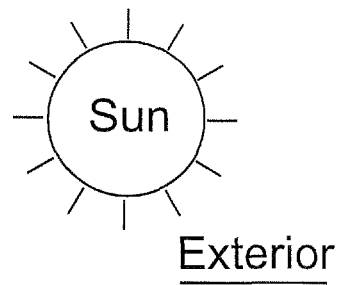
FIG. 2 is a cross sectional view of part of an insulating glass (IG) window unit including the coated article of FIG. 1 (or FIG. 3) according to an example embodiment of this invention.
Figure 2:
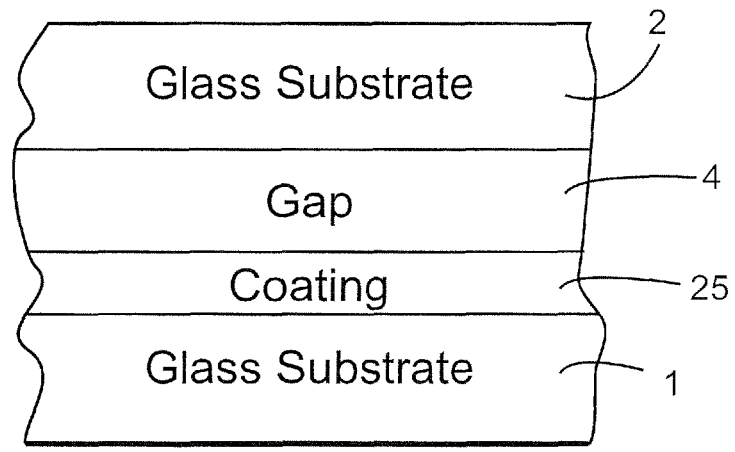

In monolithic instances, the coated article includes only one substrate such as glass substrate 1 (see FIG. 1). However, monolithic coated articles herein may be used in devices such as IG window units for example. Typically, as shown in FIG. 2, an IG window unit may include two spaced apart substrates 1 and 2, with a gap 4 defined therebetween. Example IG window units are illustrated and described, for example, in U.S. Pat. Nos. 5,770,321, 5,800,933, 6,524,714, 6,541,084 and US 2003/0150711, the disclosures of which are all hereby incorporated herein by reference. An example IG window unit as shown in FIG. 2 may include, for example, the coated glass substrate 1 shown in FIG. 1 coupled to another glass substrate 2 via spacer(s), sealant(s) or the like with a gap 4 being defined therebetween. This gap 4 between the substrates in IG unit embodiments may in certain instances be filled with a gas such as argon (Ar). An example IG unit may comprise a pair of spaced apart substantially clear glass substrates each about 4 mm thick one of which is coated with a coating 25 herein in certain example instances, where the gap 4 between the substrates may be from about 5 to 30 mm, more preferably from about 10 to 20 mm, and most preferably about 16 mm. In certain example instances, the coating 25 may be provided on the side of the inner glass substrate 1 facing the gap (although the coating may be on the other substrate in certain alternative embodiments).

In certain example IG unit embodiments of this invention, the coating 25 is designed such that the resulting IG unit (e.g., with, for reference purposes, a pair of 4 mm clear glass substrates spaced apart by 16 mm with Ar gas in the gap) has a U-value of no greater than 1.25 W/(m²K), more preferably no greater than 1.20 W/(m²K), even more preferably no greater than 1.15 W/(m²K), and most preferably no greater than 1.10 W/(m²K). U-value is measured in accordance with EN 673, the disclosure of which is hereby incorporated herein by reference.

The bottom dielectric layer 3 may be of or include titanium oxide in certain example embodiments of this invention. The titanium oxide of layer 3 may in certain example instances be represented by $TiO_x$, where x is from 1.5 to 2.5, most preferably about 2.0. The titanium oxide may be deposited via sputtering or the like in different embodiments. In certain example instances, dielectric layer 3 may have an index of refraction (n), at 550 nm, of at least 2.0, more preferably of at least 2.1, and possibly from about 2.3 to 2.6 when the layer is of or includes titanium oxide. In certain embodiments of this invention, the thickness of titanium oxide inclusive layer 3 is controlled so as to allow a* and/or b* color values (e.g., transmissive, film side reflective, and/or glass side reflective) to be fairly neutral (i.e., close to zero) and/or desirable. Other materials may be used in addition to or instead of titanium oxide in certain example instances. In certain alternative embodiments, the Ti in oxide layer 3 may be replaced with another metal.

Dielectric layer 5 is optional, and may be of or include a metal oxide such as tin oxide in certain example embodiments of this invention. Metal oxide inclusive layer 5 may be provided in order to improve adhesion between titanium oxide layer 3 and zinc oxide layer 7 in certain example embodiments. The tin oxide layer 5 may be doped with other materials such as nitrogen in certain example embodiments of this invention. In certain instances, tin oxide inclusive layer 5 may be advantageous in that it may increase the throughput of the coater producing the coating or save costs, compared to if this portion of the coating was of titanium oxide or silicon nitride which are slower to sputter and/or more expensive (although these materials are also possible).

Lower contact layer 7 in certain embodiments of this invention is of or includes zinc oxide (e.g., ZnO). The zinc oxide of layer(s) 7 may contain other materials as well such as Al (e.g., to form $ZnAlO_x$) in certain example embodiments. For example, in certain example embodiments of this invention, zinc oxide layer 7 may be doped with from about 1 to 10% Al (or B), more preferably from about 1 to 5% Al (or B), and most preferably about 2 to 4% Al (or B). The use of zinc oxide 7 under the silver in layer 9 allows for an excellent quality of silver to be achieved.

Infrared (IR) reflecting layer 9 is preferably substantially or entirely metallic and/or conductive, and may comprise or consist essentially of silver (Ag), gold, or any other suitable IR reflecting material. IR reflecting layer 9 helps allow the coating to have low-E and/or good solar control characteristics such as low emittance, low sheet resistance, and so forth. The IR reflecting layer may, however, be slightly oxidized in certain embodiments of this invention.

In certain example embodiments of this invention, the target-to-substrate distance of the silver target (e.g., silver planar target) used in sputtering IR reflecting layer 9 is reduced compared to conventional practice. Surprisingly and unexpectedly, it has been found that properties of the IR reflecting layer 9 can be improved by reducing the distance between the substrate 1 and the sputtering target(s) used in forming the IR reflecting layer(s) 9. For example, it has been found that a reduction in the target-substrate distance for a target(s) used in sputtering an IR reflecting layer(s) 9 results in an IR reflecting layer 9 having one or more of: (a) reduced sheet resistance ($R_s$), (b) reduced emittance or emissivity, (c) improved crystallinity, and/or (d) a higher and thus improved extinction coefficient (k). Accordingly, in certain example embodiments of this invention, IR reflecting layer(s) 9 are formed by sputtering a target which is located closer to the substrate 1 than conventionally. In certain example embodiments of this invention, IR reflecting layer(s) 9 is/are formed by sputtering where the Ag target being sputtering is located in accordance with a target-substrate distance of less than or equal to about 110 mm, more preferably less than or equal to about 100 mm, more preferably less than or equal to about 95 mm, still more preferably less than or equal to about 90 mm, even more preferably less than or equal to about 80 mm. Further details of the target-to-substrate distance for the silver target used in forming IR reflecting layer 9 are discussed in U.S. Provisional Patent Application 60/619,687, the disclosure of which is hereby incorporated herein by reference.

The upper contact layer 11 may be of or include an oxide of Ni and/or Cr. In certain example embodiments, upper contact layer 11 may be of or include nickel (Ni) oxide, chromium/chrome (Cr) oxide, or a nickel alloy oxide such as nickel chrome oxide ($NiCrO_x$), or other suitable material(s). The use of, for example, $NiCrO_x$ in this layer allows durability to be improved. The $NiCrO_x$ layer 11 may be fully oxidized in certain embodiments of this invention (i.e., fully stoichiometric), or alternatively may only be partially oxidized. In certain instances, the $NiCrO_x$ layer 11 may be at least about 50% oxidized. Contact layer 11 (e.g., of or including an oxide of Ni and/or Cr) may or may not be oxidation graded in different embodiments of this invention. Oxidation grading means that the degree of oxidation in the layer changes throughout the thickness of the layer so that for example a contact layer may be graded so as to be less oxidized at the contact interface with the immediately adjacent IR reflecting layer than at a portion of the contact layer(s) further or more/most distant from the immediately adjacent IR reflecting layer. Descriptions of various types of oxidation graded contact layers are set forth in U.S. Pat. No. 6,576,349, the disclosure of which is hereby incorporated herein by reference. Contact layer 11 (e.g., of or including an oxide of Ni and/or Cr) may or may not be continuous in different embodiments of this invention across the entire IR reflecting layer.

Titanium oxide layer 12 is provided on and over the IR reflecting layer 9, and directly on and contacting the contact layer 11 in the FIG. 1 embodiment. As explained herein, it has unexpectedly been found that the provision of a layer 12 consisting essentially of or comprising titanium oxide over IR reflecting layer 9 unexpectedly improves the quality of the IR reflecting layer thereby permitting the coated article to realized improved thermal and/or optical properties. The titanium oxide layer 12 may be stoichiometric ($TiO_2$) or non-stoichiometric in different embodiments of this invention.

Dielectric layer 13 may be of or include a metal oxide such as tin oxide in certain example embodiments of this invention.

Metal oxide inclusive layer 13 is provided for antireflection purposes, and also improves the emissivity of the coated article and the stability and efficiency of the manufacturing process. Moreover, tin oxide in layer 13 provides good adhesion to the titanium oxide in layer 12, and provides for good durability in this respect. The tin oxide layer 13 may be doped with other materials such as nitrogen in certain example embodiments of this invention. In certain instances, tin oxide inclusive layer 5 may be advantageous in that it may increase the throughput of the coater producing the coating or save costs, compared to if this portion of the coating was of titanium oxide or silicon nitride which are slower to sputter and/or more expensive (although these materials are also possible to replace the layer 13).

Dielectric layer 15, which may be an overcoat in certain example instances, may be of or include silicon nitride (e.g., $Si_3N_4$) or any other suitable material in certain example embodiments of this invention such as silicon oxynitride. Optionally, other layers may be provided above layer 15. Layer 15 is provided for durability purposes, and to protect the underlying layers. In certain example embodiments, layer 15 may have an index of refraction (n) of from about 1.9 to 2.2, more preferably from about 1.95 to 2.05.

Other layer(s) below or above the illustrated coating 25 may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention. For example and without limitation, layer 5 and/or layer 13 may be removed in certain example situations.

While various thicknesses may be used in different embodiments of this invention, example thicknesses and materials for the respective layers on the glass substrate 1 in the FIG. 1 embodiment are as follows, from the glass substrate outwardly (e.g., the Al content in the zinc oxide layer 7 may be from about 1-10%, more preferably from about 1-3% in certain example instances):

TABLE 1

(Example Materials/Thicknesses; FIG. 1 Embodiment)

| Layer | Preferred Range (Å) | More Preferred (Å) | Example (Å) |
|---|---|---|---|
| $TiO_x$ (layer 3) | 30-400 Å | 80-250 Å | 180 Å |
| $SnO_2$ (layer 5) | 10-300 Å | 10-100 Å | 20 Å |
| $ZnAlO_x$ (layer 7) | 10-300 Å | 60-120 Å | 50 Å |
| Ag (layer 9) | 50-250 Å | 80-150 Å | 130 Å |
| $NiCrO_x$ (layer 11) | 10-80 Å | 20-70 Å | 30 Å |
| $TiO_x$ (layer 12) | 10-300 Å | 20-100 Å | 40 Å |
| $SnO_2$ (layer 13) | 40-400 Å | 100-200 Å | 160 Å |
| $Si_3N_4$ (layer 15) | 50-750 Å | 150-350 Å | 210 Å |

In certain example embodiments of this invention, coated articles herein may have the following low-E (low emissivity), solar and/or optical characteristics set forth in Table 2 when measured monolithically. The specific resistivity (SR) is of the silver IR reflecting layer 9.

TABLE 2

Low-E/Solar Characteristics (Monolithic; no HT)

| Characteristic | General | More Preferred | Most Preferred |
|---|---|---|---|
| $R_s$ (ohms/sq.): | <=6.0 | <=4.5 | <=3.5 |
| Ag SR (microohms · cm): | <=5.0 | <=4.8 | <=4.6 |
| $E_n$: | <=0.10 | <=0.06 | <=0.040 |
| $T_{vis}$ (%): | >=70 | >=80 | >=85 |

It can be seen that the coated article has a reduced (i.e., better) SR for the silver IR reflecting layer 9 compared to the 5.43 micro-ohms·cm value mentioned above when the titanium oxide layer 12 is not present. Thus, it can be seen that the presence of the titanium oxide layer 12 surprisingly results in improved specific resistivity of the IR reflecting layer, and thus improved thermal properties.

Moreover, coated articles including coatings according to certain example embodiments of this invention have the following optical characteristics (e.g., when the coating(s) is provided on a clear soda lime silica glass substrate 1 from 1 to 10 mm thick, preferably about 4 mm thick). In Table 3, all parameters are measured monolithically.

TABLE 3

Example Optical Characteristics (Monolithic)

| Characteristic | General | More Preferred |
|---|---|---|
| $T_{vis}$ (or TY)(Ill. C, 2 deg.): | >=70% | >=80% (or >=85%) |
| $a^*_t$ (Ill. C, 2°): | -2.5 to +1.0 | -2.0 to 0.0 |
| $b^*_t$ (Ill. C, 2°): | -1.0 to +4.0 | 0.0 to 2.5 |
| $L^*_t$: | >=90 | >=93 |
| $R_fY$ (Ill. C, 2 deg.): | 1 to 7% | 1 to 6% |
| $a^*_f$ (Ill. C, 2°): | -5.0 to +4.0 | -1.5 to +3.0 |
| $b^*_f$ (Ill. C, 2°): | -14.0 to +10.0 | -10.0 to 0 |
| $L^*_f$: | 22-30 | 24-27 |
| $R_gY$ (Ill. C, 2 deg.): | 1 to 10% | 1 to 9% |
| $a^*_g$ (Ill. C, 2°): | -5.0 to +4.0 | -1.5 to +3.0 |
| $b^*_g$ (Ill. C, 2°): | -14.0 to +10.0 | -10.0 to 0 |
| $L^*_g$: | 27-36 | 30-35 |

Moreover, coated articles including coatings according to certain example embodiments of this invention have the following optical characteristics when the coated article is an IG unit in certain example embodiments (e.g., for purposes of reference, when the coating is provided on a clear soda lime silica glass substrate 1 from 1 to 10 mm thick, preferably about 4 mm thick) on surface #3 of an IG window unit. It is noted that U-value is measured in accordance with EN 673.

TABLE 4

Example Optical Characteristics (IG Unit)

| Characteristic | General | More Preferred |
|---|---|---|
| $T_{vis}$ (or TY)(Ill. C, 2 deg.): | >=70% | >=78% |
| $a^*_t$ (Ill. C, 2°): | -4.0 to +1.0 | -3.0 to 0.0 |
| $b^*_t$ (Ill. C, 2°): | -1.0 to +4.0 | 0.0 to 3.0 |
| $R_{outside}Y$ (Ill. C, 2 deg.): | <=14% | <=12% |
| $a^*_{out}$ (Ill. C, 2°): | -3.0 to +3.0 | -2 to +2.0 |
| $b^*_{out}$ (Ill. C, 2°): | -10.0 to +10.0 | -6.0 to 0 |
| $R_{inside}Y$ (Ill. C, 2 deg.): | <=14% | <=12% |
| $a^*_{inside}$ (Ill. C, 2°): | -5.0 to +4.0 | -1.5 to +3.0 |
| $b^*_{inside}$ (Ill. C, 2°): | -14.0 to +10.0 | -10.0 to 0 |
| U-value (IG)(W/($m^2$K)): | <=1.25 | <=1.15 (or <=1.10) |

Figure 3:
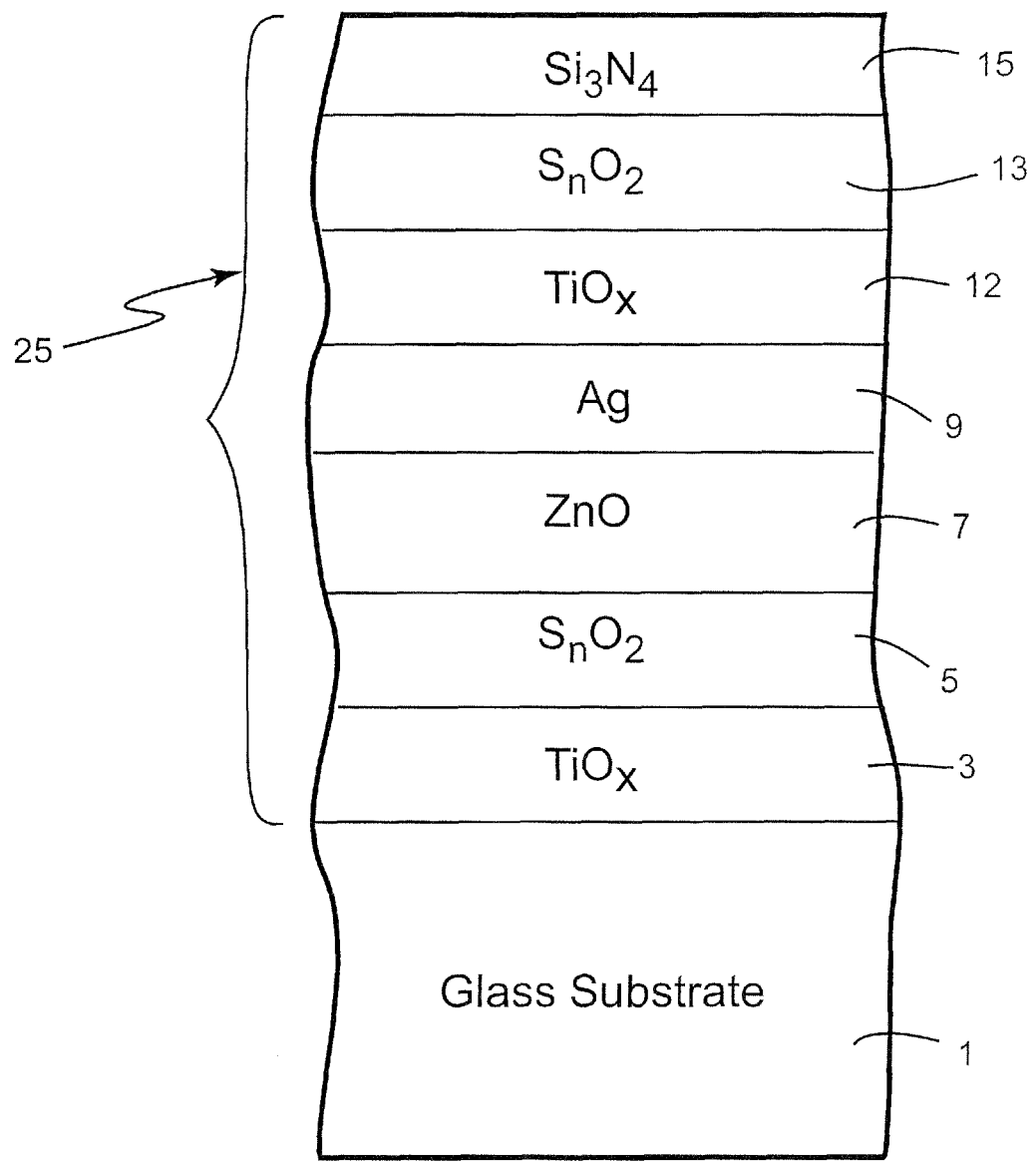
FIG. 3 is a cross sectional view of a coated article according to another example embodiment of this invention.

FIG. 3 is a cross sectional view of another example embodiment of this invention. In the FIG. 3 embodiment, the titanium oxide layer 12 is provided over and in contact with the IR reflecting layer 9 (i.e., contact layer 11 from the FIG. 1 embodiment has been removed). The characteristics set forth above in Tables 1-4 may apply to the FIG. 3 embodiment also (in addition to the FIG. 1 embodiment, and other embodiments of this invention).

Figure 4:
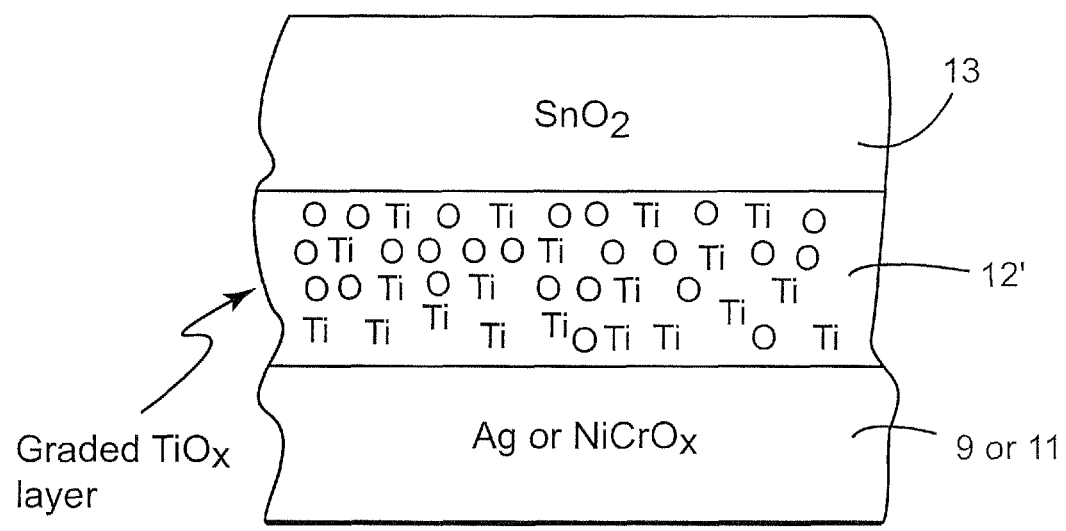
FIG. 4 is a cross sectional view illustrating that according to certain example embodiments of this invention a layer comprising titanium oxide may be deposited in an oxidation graded manner.

In certain example embodiments of this invention, the titanium oxide layer over the IR reflecting layer may be oxidation graded (see graded titanium oxide layer 12' in FIG. 4). FIG. 4 illustrates an example oxidation graded titanium oxide layer 12' which may be used as layer 12 in any of the FIG. 1-3 embodiments of this invention. In certain example embodiments, as shown in FIG. 4 for example, the titanium oxide layer 12' may be more oxided at a location further from the IR reflecting layer 9 than at a location closer to the IR reflecting layer 9. Surprisingly, this has been found to improve the adhesion of the titanium oxide layer 12' to the underlying layer such as a layer comprising $NiCrO_x$ 11 or silver 9. In other example embodiments of this invention, the titanium oxide 12' layer may be more oxided at a location proximate a central portion of the layer than at respective locations closer to the upper and lower surfaces of the layer 12'. Again, this has been found to improve the adhesion of the layer 12' comprising titanium oxide to the layers below (9 or 11) and above (13) the titanium oxide layer 12'.

In one example embodiment of this invention, this oxidation grading of titanium oxide layer 12' as deposited may be carried out by sputtering layer 12 onto the substrate using 3 CMAG Ti (or $TiO_x$) targets, or any other suitable number of Ti inclusive target(s). The second and third targets may have oxygen introduced into their respective sputtering atmospheres. However, no oxygen is intentionally introduced into the atmosphere of the first Ti inclusive target, or alternatively it is only intentionally introduced into the downstream side of the first Ti inclusive target but not the upstream side. This causes the first portion of the titanium oxide layer 12' that is deposited to be more metallic than later portions of the titanium oxide layer 12' that are sputtered to make up the overall layer 12'. The characteristics set forth above in Tables 1-4 may apply to oxidation graded embodiments.

EXAMPLE

The following example is provided for purposes of example only, and is not intended to be limiting. The following Example was made via sputtering so as to have approximately the layer stack set forth below, from the clear glass substrate outwardly. The listed thicknesses are approximations:

TABLE 5

Layer Stack for Example

| Layer | Thickness |
|---|---|
| Glass Substrate | 4 mm |
| $TiO_x$ | 180 Å |
| $SnO_2$ | 20 Å |
| $ZnAlO_x$ | 50 Å |
| Ag | 135 Å |
| $NiCrO_x$ | 30 Å |
| $TiO_x$ | 40 Å |
| $SnO_2$ | 160 Å |
| $Si_3N_4$ | 210 Å |

Figure 5:
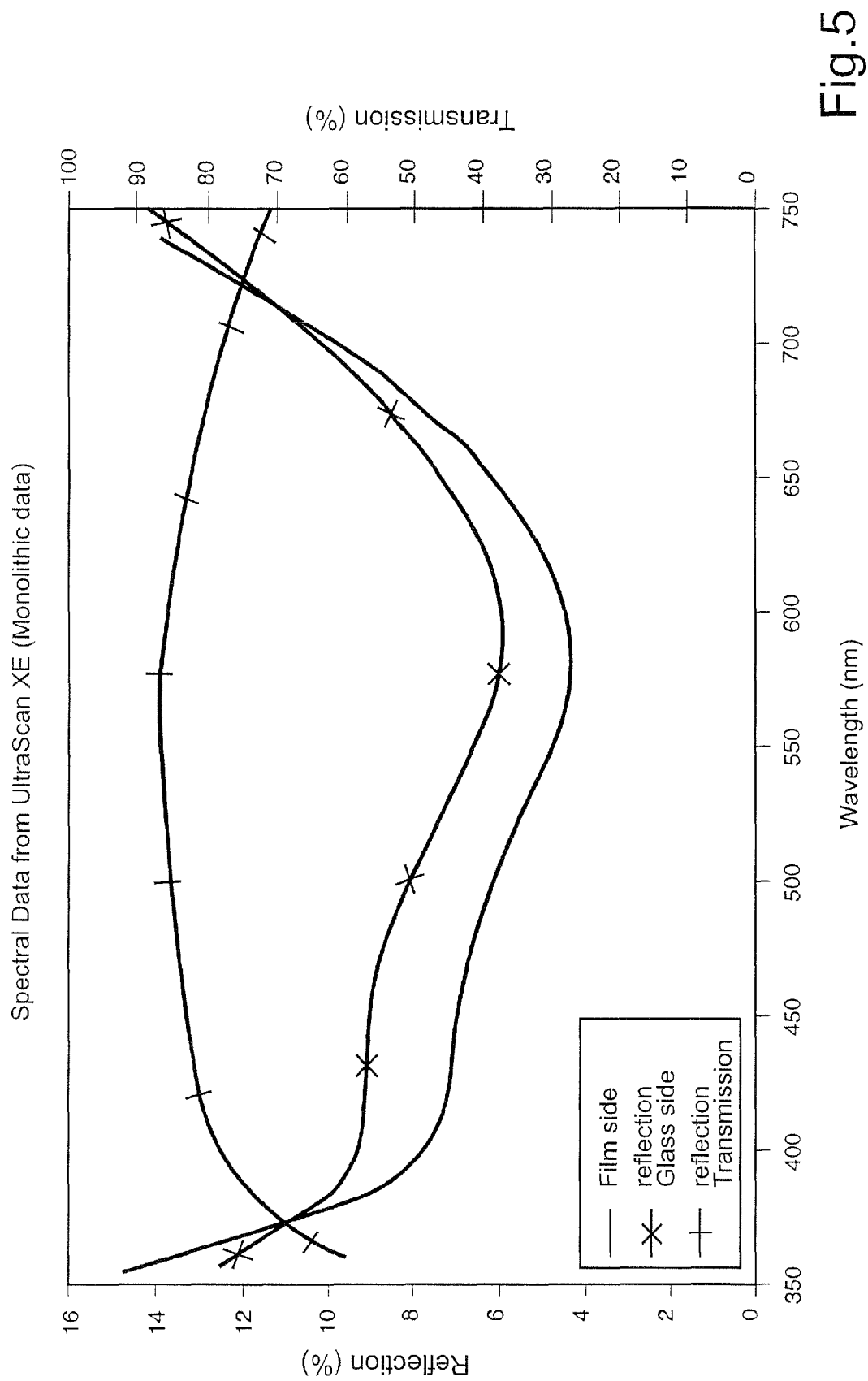
FIG. 5 is a graph plotting monolithic reflection vs. transmission for the coated article of Example 1.

The silver layer was sputtered using two silver planar targets, and using gas flows including Ar and Kr, where much more Ar than Kr was used. After being sputter deposited onto the glass substrate, the coated article of the Example had the following characteristics, measured monolithically. FIG. 5 also illustrates certain characteristics of this Example, in graph form.

TABLE 6

Characteristics of Example (Monolithic)

| Characteristic | Example |
|---|---|
| Visible Trans. ($T_{vis}$ or TY)(Ill. C 2 deg.): | 86.53% |
| a* | −1.84 |
| b* | 2.15 |
| L* | 94.54 |
| Glass Side Reflectance (RY)(Ill C, 2 deg.): | 6.67% |
| a* | 1.05 |
| b* | −8.03 |
| L* | 31.05 |
| Film Side Reflective (FY)(Ill. C, 2 deg.): | 4.96 |
| a* | 2.11 |
| b* | −8.01 |
| L* | 26.61 |
| $R_s$ (ohms/square): | 3.4 |
| $E_n$: | 0.034 |
| Ag SR (micro-ohms · cm): | 4.56 |

Compared to the coated article discussed above in the background section, it can be seen that the addition of the titanium oxide layer 12 over the silver IR reflecting layer 9 surprisingly caused the specific resistivity (SR) of the IR reflecting layer 9 to drop, thereby permitting thermal properties of the coating to improve (compare the SR for the IR reflecting layer 9 of 4.56 micro-ohms·cm in the aforesaid Example, versus the higher value of 5.43 for the coating without titanium oxide layer 12 discussed in the background section). This evidences unexpected results.

Moreover, with respect to the IR reflecting layer 9 having been sputter-deposited using a mixture of Ar and Kr gases, it has surprisingly been found that the use of Kr gas during the vacuum sputtering process for the IR reflecting layer of or including Ag results in improved k values for an IR reflecting layer comprising Ag, and thus improved resistance and/or emittance properties.

When the aforesaid monolithic Example was used in an IG window unit, the IG window unit had a U-value of about 1.1 W/(m²K).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making a coated article, the method comprising:
providing a glass substrate;
forming a dielectric layer on the substrate;
forming an IR reflecting layer comprising silver on the substrate over at least the dielectric layer;
depositing a layer comprising titanium oxide on the substrate over the IR reflecting layer in a manner so that the layer comprising titanium oxide as deposited is more oxided at a location therein further from the IR reflecting layer than at a location closer to the IR reflecting layer.

2. The method of claim 1, further comprising coupling the glass substrate with the recited layers thereon to another substrate in forming an IG window unit, wherein the IG window unit has a U-value of no greater than 1.15 W/(m$^2$K).

3. The method of claim 1, wherein the IR reflecting layer comprising silver has a specific resistivity (SR) of no greater than 4.6 micro-ohms.cm.

4. The method of claim 1, further comprising forming a layer comprising an oxide of Ni and/or Cr that is located between and contacting the IR reflecting layer and the layer comprising titanium oxide.

5. The method of claim 1, wherein said dielectric layer comprise zinc oxide.

6. The method of claim 1, wherein said depositing comprises sputtering.

7. The method of claim 1, wherein said forming the IR reflecting layer comprises sputtering the IR reflecting layer.

8. The method of claim 1, further comprising forming a dielectric layer comprising titanium oxide directly on the glass substrate, so that said dielectric layer is located over said dielectric layer comprising titanium oxide.

9. The method of claim 8, wherein said dielectric layer comprising titanium oxide comprises TiO$_2$.

\* \* \* \* \*